(12) United States Patent
Huemoeller et al.

(10) Patent No.: US 6,784,376 B1
(45) Date of Patent: Aug. 31, 2004

(54) SOLDERABLE INJECTION-MOLDED INTEGRATED CIRCUIT SUBSTRATE AND METHOD THEREFOR

(75) Inventors: Ronald Patrick Huemoeller, Chandler, AZ (US); Sukianto Rusli, Phoenix, AZ (US)

(73) Assignee: Amkor Technology, Inc.

( * ) Notice: Subject to any disclaimer, the term of this patent is extended or adjusted under 35 U.S.C. 154(b) by 119 days.

(21) Appl. No.: 09/931,144

(22) Filed: Aug. 16, 2001

(51) Int. Cl.[7] .......................... H01R 12/04; H05K 1/11
(52) U.S. Cl. ........................ 174/262; 174/260
(58) Field of Search ...................... 174/262–266, 174/260; 361/783

(56) References Cited

U.S. PATENT DOCUMENTS

| | | | |
|---|---|---|---|
| 4,996,391 A | * | 2/1991 | Schmidt ..................... 174/255 |
| 5,081,520 A | | 1/1992 | Yoshii et al. |
| 5,371,654 A | * | 12/1994 | Beaman et al. ............. 361/744 |
| 6,392,160 B1 | * | 5/2002 | Andry et al. ................ 174/261 |
| 6,407,930 B1 | * | 6/2002 | Hsu ........................... 361/784 |

* cited by examiner

Primary Examiner—David A. Zarneke
Assistant Examiner—Jeremy Norris
(74) Attorney, Agent, or Firm—Weiss, Moy & Harris, P.C.

(57) ABSTRACT

A solderable injection-molded integrated circuit substrate provides a mounting and interconnect structure for integrated circuits. Circuit traces within channels on the substrate provide interconnects that are isolated by the channel sides and solderable mounting contacts for Ball Grid Array (BGA) or wire-bondable integrated circuit dies. The substrate is injection-molded and then electroplated or seed plated and an etchant-resistive material is applied. The substrate is exposed to an etchant, removing the plated material from undesired locations and leaving the plated material in contact areas and trace areas within the channels. An integrated circuit die is then wire-bonded or solder ball attached to the substrate.

22 Claims, 5 Drawing Sheets

SOLDERABLE INJECTION-MOLDED INTEGRATED CIRCUIT SUBSTRATE AND METHOD THEREFOR

FIELD OF THE INVENTION

The present invention relates generally to semiconductor packaging, and more specifically, to a solderable injection-molded substrate for providing electrical and mechanical connection to integrated circuit dies.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacings, thus setting another practical limit on the interconnect density.

Therefore, it would be desirable to provide a method and substrate having improved interconnect density with a low associated manufacturing cost. It would further be desirable to provide a method and substrate having reduced susceptibility to shorting and migration between conductors.

SUMMARY OF THE INVENTION

A solderable injection-molded substrate and a method for manufacturing an injection-molded substrate generate a circuit pattern within a substrate having solderable wire-bonding or solder ball attach pads. A substrate is injection molded using a tool formed in the shape of the desired circuit pattern and conductor is deposited on the substrate. An etchant resistive compound is applied to the conductor-coated substrate and conductor is removed with an etchant. The conductor that remains on the substrate is plated with a plating suitable for soldering or wire-bonding and finally, an integrated circuit die is attached via wire-bonding, solder-ball attach or a combination of attachment techniques.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
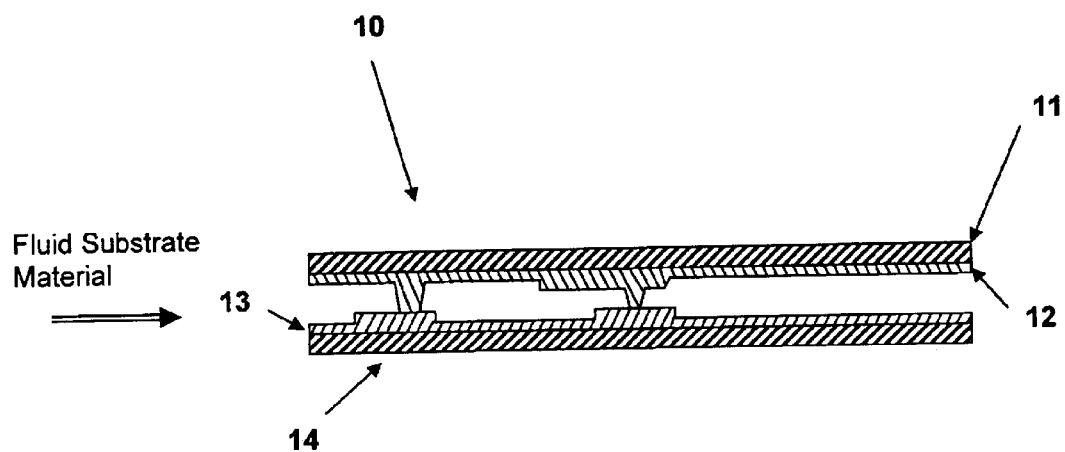
FIG. 1 is a pictorial diagram depicting a substrate and a tool for injection-molding in accordance with an embodiment of the invention.

Referring now to the figures and in particular to FIG. 1, a mold 10 in accordance with an embodiment of the present invention is depicted. Mold 10 is used to form a substrate in a novel process that permits embedding circuits beneath the top surface of a substrate and isolating the circuits in channels. Mold 10 comprises a machine having a plate 11 for supporting a thin metal tool foil 12. Tool foil 12 is stamped to form an outline that conforms to a reverse image of desired contour of the top of the substrate after processing. A bottom plate 14, which may include a thin metal tool foil 13 having features defining bottom channels in the substrate, is placed adjacent to the top tool foil 12, and fluid substrate material is injected to form a substrate. The mold is then opened by separating bottom plate 14 and top plate 11 and the molded substrate is removed.

Insulative plastic materials suitable for injection molding are introduced into mold 10 and permitted to cure until the surface is not tacky. Suitable materials include Plaskon SMT-B-IRC and Nitto HC100XJAA, which are mold compound materials presently used in injection molding processes.

The mold tool foils can be made with existing processes that are used in the formation of stamps for manufacturing compact discs (CDs). In the CD manufacturing process, metal foil is stamped using a master that is created for the production of multiple foils. The foils are then attached (embedded) in a polymer resin to support the foils. To support the process of the present invention, metal foils can be made in the same manner, but may be reused.

Figure 2A:
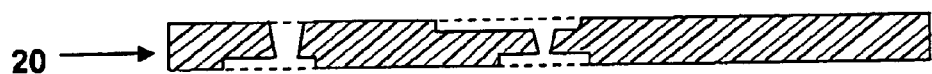
FIGS. 2A–2F are pictorial diagrams depicting various stages of preparation of a substrate in accordance with an embodiment of the invention.

Referring now to FIG. 2A, the first stage in the preparation of molded substrate 20 in accordance with an embodiment of the present invention is depicted. Substrate 20 has been removed from mold 10 and metal tool foils 12 and 13 have generated voids and channels in accordance with the figure. Dashed lines show that the voids and channels are localized features and that substrate 20 extends into and out of the plane of the figure.

Figure 2B:
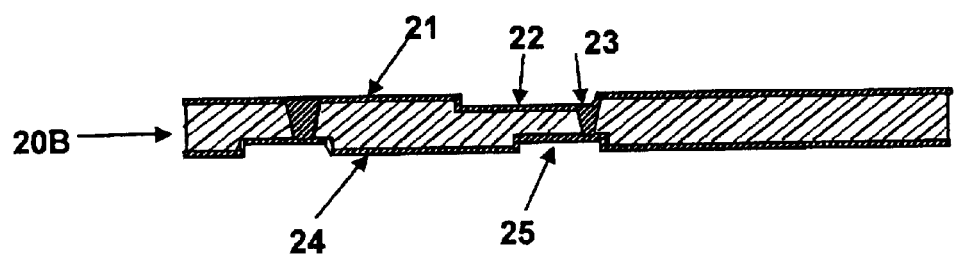

Referring now to FIG. 2B, top copper plating 21 is seed plated or electrolytically deposited on the surface of substrate to form plated substrate 20B. Bottom copper plating 24 may also be applied depending on whether or not a double-sided substrate is being produced. Top channel 22 is plated to form a conductive circuit path, a via 23 is plated through to connect to a bottom channel 25. The sides of via 23 are angled to promote the growth of the plating material through the void in substrate 20, yielding a more reliable plating process.

Figure 2C:
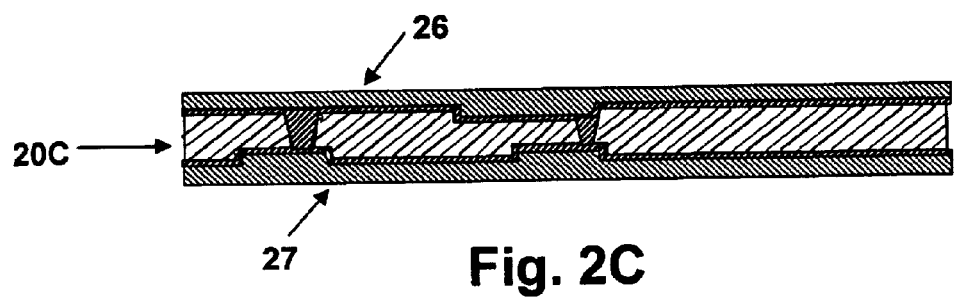
Figure 2D:
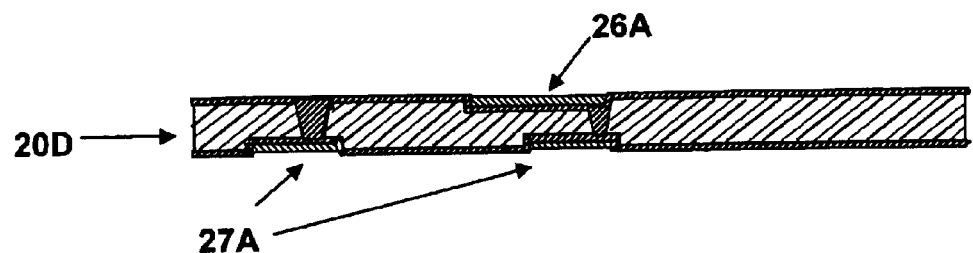

Next, as depicted in FIG. 2C, a permanent etchant resist material is applied to substrate 20B to produce coated substrate 20C. Then, as illustrated in FIG. 2D, the etchant resist is planarized to remove the etchant resist from areas in which the copper plating is to be removed, and leaving the etchant resist 27A in areas in which the copper plating is to remain.

Figure 2E:
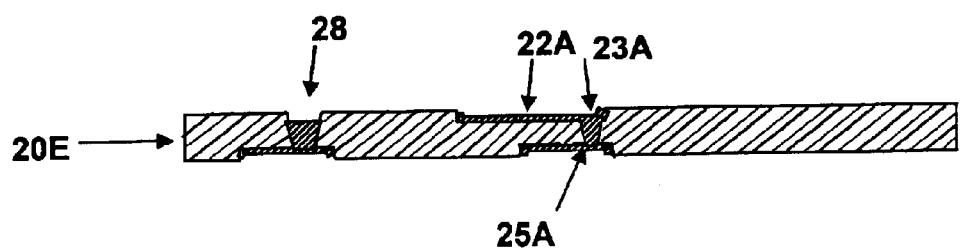

Next, as depicted in FIG. 2E, the copper plating is etched and the permanent resist is removed, leaving circuit channels 25A and 22A, via 23A and a solder ball mounting area 28. Circuit channel 22A can be used for wire-bonding connections from a die mounted on the substrate, or may be circuit traces extending out of the plane of the figures for routing circuit traces.

Figure 2F:
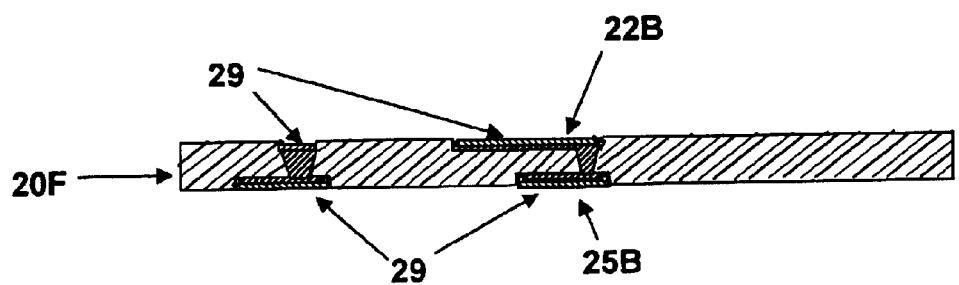

Finally, referring to FIG. 2F, substrate 20E is electroplated with a material resistant to oxidation such as gold or nickel 29, preparing the substrate for solder ball attachment or wire-bonding of dies or external circuits by producing plated channels 22B and 25B.

While the figures illustrate three conductive circuit channels, the figures are depicting only a portion of the total substrate. More than a hundred circuit channels 22A and 25A will generally be used in an integrated circuit design and may be oriented in any direction within the surface of substrate 20E. Additionally, materials other than copper may be used, depending on the process used. For example if etching is not necessary for a particular circuit, gold foil may be applied to the channels formed in an injection-molded substrate. The present invention provides a process for forming circuits within channels in a substrate that are below the top surface of the substrate. This an improvement over the present state of the art, which generally provides only surface conductors. The channels formed by embossing place the conductors below the surface and the conductors are thereby insulated from adjacent conductors by the substrate.

Figure 3:
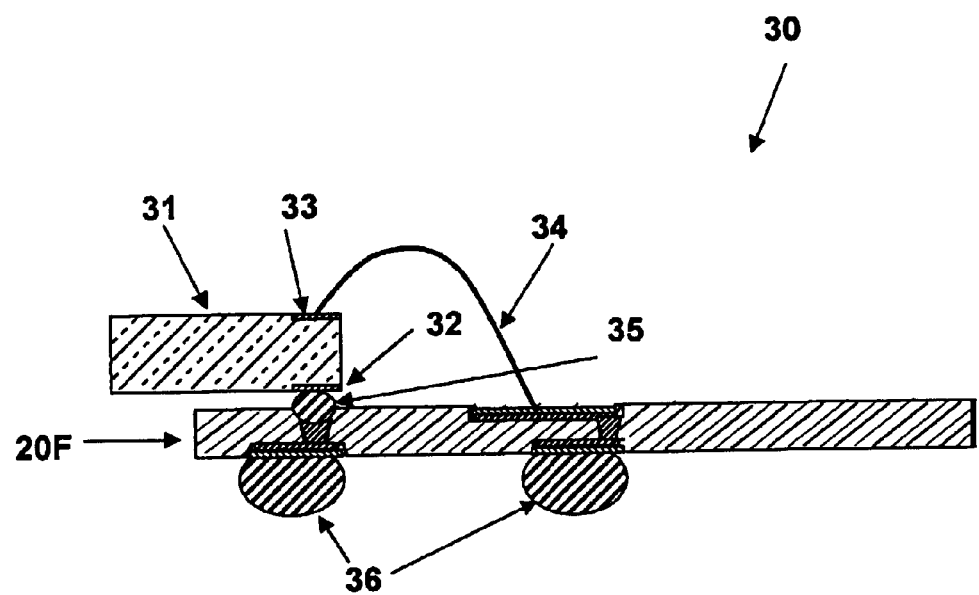
FIG. 3 is a pictorial diagram depicting an integrated circuit in accordance with an embodiment of the invention.

Referring now to FIG. 3, an integrated circuit 30 in accordance with an embodiment of the invention is depicted. A die 31 having electrical contact 32 is attached to substrate 20F by a solder ball 35. The solder ball provides electrical and thermal connection from die 31 to substrate 20F. A wire 34 is bonded to a wire-bond area 33 on die and to channel 22B providing a combined wire-bond (for top side connections) and solder ball attach (for bottom side connections) for die 31, but exclusively wire-bond or solder ball techniques may be used. Additionally, die may be mounted in a recess molded into substrate, rather than surface mounting as depicted in FIG. 3. Ball grid array (BGA) connections for the integrated circuit package are provided by solder balls 36 attached to the bottom channels (or pads) formed in substrate 20F.

While channels 22B and 25B are shown as contact points for integrated circuit die 31 connections, channels 22B and 25B may extend in the plane of the figure to any point on substrate 20F providing routing of the electrical connections to die 31 and possibly other components mounted on substrate 20F, including multiple integrated circuit dies. Channels may be formed purely for interconnect or for solder ball attachment or a combination.

Figure 4A:
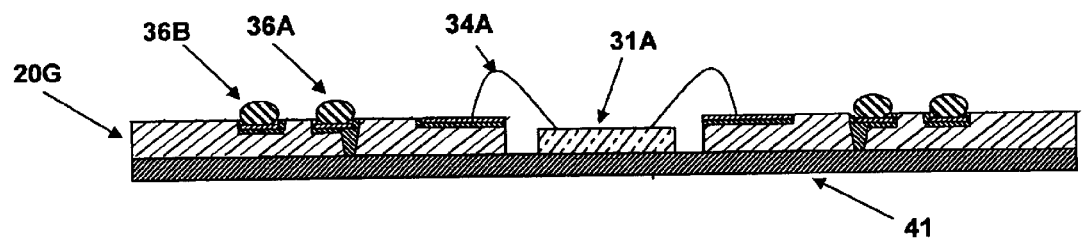
FIGS. 4A and 4B are pictorial diagrams depicting integrated circuits in accordance with alternative embodiments of the invention.

Referring now to FIG. 4A, an integrated circuit in accordance with an alternative embodiment of the invention is depicted. Substrate 20G is injection molded and plated by the above-described process, but includes a recess for mounting a die 31A and wire-bond pads for connection of die 31A via wires 34A. Solder ball 36A is attached to circuit material having a via through to a conductive surface 41 attached to the bottom of substrate 20G, which may be electrically conductive, thermally conductive or both. Solder ball 36B provides a connection to circuit material forming traces, which may be connected to the wire-bond pads. The purpose of FIG. 4A is to illustrate examples of alternative structures that may be generated by the techniques of the present invention, such as vias to a conductive plane and die mounting within the plane of the substrate.

Figure 4B:
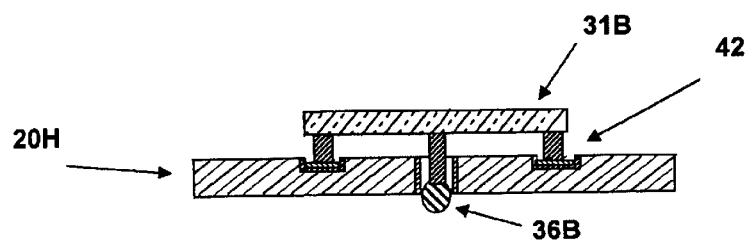

Referring now to FIG. 4B, an integrated circuit in accordance with yet another alternative embodiment of the invention is depicted. Substrate 20H is injection molded and plated by the above-described process, but includes a through-hole for attaching a solder ball 36B to a mounting post from die 31B and flip chip post terminals for connection of die 31B via the integral flip-chip posts. Solder ball 36B secures die 31B mechanically while the posts 42 provide electrical connections. Circuit material within the mounting post area also provides electrical connection to the mounting post.

The above description of embodiments of the invention is intended to be illustrative and not limiting. Other embodiments of this invention will be obvious to those skilled in the art in view of the above disclosure and fall within the scope of the present invention.

What is claimed is:

1. An integrated circuit, comprising:
    an injection-molded substrate having top channels for addition of circuit material, the top channels having sides extending to a plane defining a top surface of the substrate and a bottom beneath the plane;
    a die mounted to the substrate;
    a plurality of electrical terminals mounted to the substrate for connecting the die to external circuits;
    circuit material deposited within the channels for forming an electrical connection between the die and the electrical terminals; and
    a solderable plating layer deposited over the circuit material for preventing oxidation of the circuit material.

2. The integrated circuit of claim 1, wherein the substrate further has bottom channels having sides extending to a bottom plane defining a bottom surface of the substrate and a top beneath the top surface, and wherein the circuit material is further deposited within the bottom channels.

3. The integrated circuit of claim 2, wherein the circuit material connects circuit material within top channels and circuit material within bottom channels through molded voids in said injection-molded substrate.

4. The integrated circuit of claim 1, further comprising at least one other die mounted on the substrate, and wherein the circuit material further forms electrical connections between the die and the at least one other die.

5. The integrated circuit of claim 1, wherein the circuit material forms wire bond pads for attaching wire-bond connections from the die, and wherein the substrate includes a well for mounting the die and wire-bond pads on a top side of the substrate, and wherein the wire-bond connections extend from the top of the die to the wire bond pads.

6. The integrated circuit of claim 1, further comprising a conductive sheet on the bottom of the substrate, and where the circuit material connects circuit material within top channels with the conductive sheet.

7. An integrated circuit, comprising:
    an injection-molded substrate having top channels for addition of circuit material, the top channels having sides extending to a plane defining a top surface of the substrate and a bottom beneath the plane;
    a die mounted to the substrate;
    a plurality of electrical terminals mounted to the substrate for connecting the die to external circuits;
    circuit material deposited within the channels for forming an electrical connection between the die and the electrical terminals; and
    a conductive sheet on the bottom of the substrate, and where the circuit material connects circuit material within top channels with the conductive sheet.

8. The integrated circuit of claim 7, wherein the substrate further has bottom channels having sides extending to a bottom plane defining a bottom surface of the substrate and a top beneath the top surface, and wherein the circuit material is further deposited within the bottom channels.

9. The integrated circuit of claim 8, wherein the circuit material connects circuit material within top channels and circuit material within bottom channels through molded voids in said injection-molded substrate.

10. The integrated circuit of claim 9, wherein said voids have a substantially conical shape to promote plating growth through said voids.

11. The integrated circuit of claim 10, further comprising at least one other die mounted on the substrate, and wherein the circuit material further forms electrical connections between the die and the at least one other die.

12. An integrated circuit, comprising:
    an injection-molded substrate having top channels for addition of circuit material, the top channels having sides extending to a plane defining a top surface of the substrate and a bottom beneath the plane;
    a die mounted to the substrate;
    a plurality of electrical terminals mounted to the substrate for connecting the die to external circuits; and
    circuit material deposited within the channels for forming an electrical connection between the die and the electrical terminals, wherein the substrate further has bottom channels having sides extending to a bottom plane defining a bottom surface of the substrate and a top beneath the top surface, and wherein the circuit material is further deposited within the bottom channels, wherein the circuit material connects circuit material within top channels and circuit material within bottom channels through molded voids in said injection-molded substrate, and wherein the voids have a substantially conical shape to promote plating growth through the voids.

13. The integrated circuit of claim 12, further comprising at least one other die mounted on the substrate, and wherein the circuit material further forms electrical connections between the die and the at least one other die.

14. The integrated circuit of claim 12, wherein the substrate and the circuit material form die connection pads for solder-ball mounting of the die to the substrate.

15. The integrated circuit of claim 12, further comprising a solderable plating layer deposited over the circuit material for preventing oxidation of the circuit material.

16. The integrated circuit of claim 12, wherein the circuit material forms wire bond pads for attaching wire-bond connections from the die.

17. The integrated circuit of claim 16, wherein the substrate includes a well for mounting the die and wire-bond pads on a top side of the substrate, and wherein the wire-bond connections extend from the top of the die to the wire bond pads.

18. An integrated circuit, comprising:
    an injection-molded substrate having top channels for addition of circuit material, the top channels having sides extending to a plane defining a top surface of the substrate and a bottom beneath the plane;
    a die mounted to the substrate;
    a plurality of electrical terminals mounted to the substrate for connecting the die to external circuits; and
    circuit material deposited within the channels for forming an electrical connection between the die and the electrical terminals,
    wherein the circuit material forms wire bond pads for attaching wire-bond connections from the die, and wherein the substrate includes a well for mounting the die and wire-bond pads on a top side of the substrate, and wherein the wire-bond connections extend from the top of the die to the wire bond pads.

19. The integrated circuit of claim 18, wherein the substrate further has bottom channels having sides extending to a bottom plane defining a bottom surface of the substrate and a top beneath the top surface, and wherein the circuit material is further deposited within the bottom channels.

20. The integrated circuit of claim 19, wherein the circuit material connects circuit material within top channels and circuit material within bottom channels through molded voids in said injection-molded substrate.

21. The integrated circuit of claim 18, further comprising at least one other die mounted on the substrate, and wherein the circuit material further forms electrical connections between the die and the at least one other die.

22. The integrated circuit of claim 18, further comprising a conductive sheet on the bottom of the substrate, and where the circuit material connects circuit material within top channels with the conductive sheet.

* * * * *